United States Patent
Shieh et al.

[11] Patent Number: 5,804,985
[45] Date of Patent: Sep. 8, 1998

[54] PROGRAMMABLE OUTPUT BUFFER AND METHOD FOR PROGRAMMING

[75] Inventors: Jhy-Jer Shieh, Phoenix; Dandas Kenneth Tang, Chandler, both of Ariz.

[73] Assignee: Motorola, Inc., Schaumburg, Ill.

[21] Appl. No.: 626,590

[22] Filed: Apr. 2, 1996

[51] Int. Cl.$^6$ .................. H03K 19/0175; H03K 7/38
[52] U.S. Cl. ........................ 326/39; 326/38; 326/83; 326/81
[58] Field of Search .................. 326/38, 39, 83, 326/81

[56] References Cited

U.S. PATENT DOCUMENTS

| | | | |
|---|---|---|---|
| 3,979,730 | 9/1976 | Bennett et al. | |
| 5,217,211 | 6/1993 | Tang et al. | 326/39 |
| 5,233,241 | 8/1993 | Nishimori | 326/38 |
| 5,336,950 | 8/1994 | Popli et al. | |
| 5,394,034 | 2/1995 | Becker et al. | 326/83 |
| 5,469,082 | 11/1995 | Bullinger et al. | 326/83 |
| 5,489,862 | 2/1996 | Risinger et al. | 326/83 |

OTHER PUBLICATIONS

The PCI Bus Monitor, Q4 '95, (four pages).

*Primary Examiner*—Edward P. Westin
*Assistant Examiner*—Richard Roseen
*Attorney, Agent, or Firm*—Rennie William Dover

[57] ABSTRACT

The present invention provides an output buffer on a monolithic integrated circuit with programmability, such that one of sixteen output configurations is selected for providing the proper signaling interface to peripheral devices. An input signal (SELECT) in selector circuit (12) provides the transfer of one of two sets of input data signals into function control circuit (14). With the input signal (EN) applied, control signals in the function control circuit (14) set the configuration mode for the output buffer circuit (16). The data input signal INPUT DATA, in accordance with the programmed configuration mode for the output buffer circuit (16), transitions the output signal, DBOUT. The output buffer circuit (16) is programmable for providing an open-drain output, a tri-stated output, a high current output, a low current output, a PCI output, and an output selected from two operating voltages for signal level translation functions.

18 Claims, 3 Drawing Sheets

PROGRAMMABLE OUTPUT BUFFER AND METHOD FOR PROGRAMMING

BACKGROUND OF THE INVENTION

The present invention relates, in general, to integrated circuit devices and, more particularly, to the configuration features of a Complementary Metal Oxide Semiconductor (CMOS) output buffer.

Integrated CMOS output buffers provide data signals external to the integrated circuit as digital representations of the buffer's internal input data. Data transfers of internal signals to external peripheral devices move data through the output buffer. Output buffers provide data isolation for internal signals from large capacitive loads of external peripheral devices. To provide isolation and drive the large capacitive loads, output buffers have large output transistor device sizes capable of supplying source and sink currents in accordance with desired output signal rise and fall times. When the output buffer is not intended to sink or source currents at the output node, the output buffer is in an off condition or tri-stated.

High rates-of-change of current in an output buffer driving external capacitive loads during high speed logic level transitions create unwanted current and voltage transients on power supplies of integrated circuits. Sharp rise and fall times from high speed logic level transitions of the output signal cause ElectroMagnetic Interference (EMI) inherent to the high frequency components comprising the output signal. One type of output buffer limits transients by controlling the sharp signal edges using slew rate logic circuitry. Another type of output buffer provides output drive capability using an open-drain configuration. For example, a distributed NOR gate function includes open-drain output buffers from multiple integrated circuits connected to a pull-up resistor. With open-drain output buffers connected in this manner, correct level data supplied to the input of any of the commonly connected open-drain output buffers is capable of pulling the distributed NOR gate output signal low.

Hence, a need exists for a monolithic integrated circuit to interface with a variety of peripheral devices each requiring different electrical signal requirements for receiving data. Peripheral circuits may specify open-drain outputs, high current drive output buffers driving large external capacitive loads, low current drive output buffers for controlling voltage transients, or output buffers with slew rate control for EMI interference.

DETAILED DESCRIPTION OF THE DRAWINGS

Figure 1:
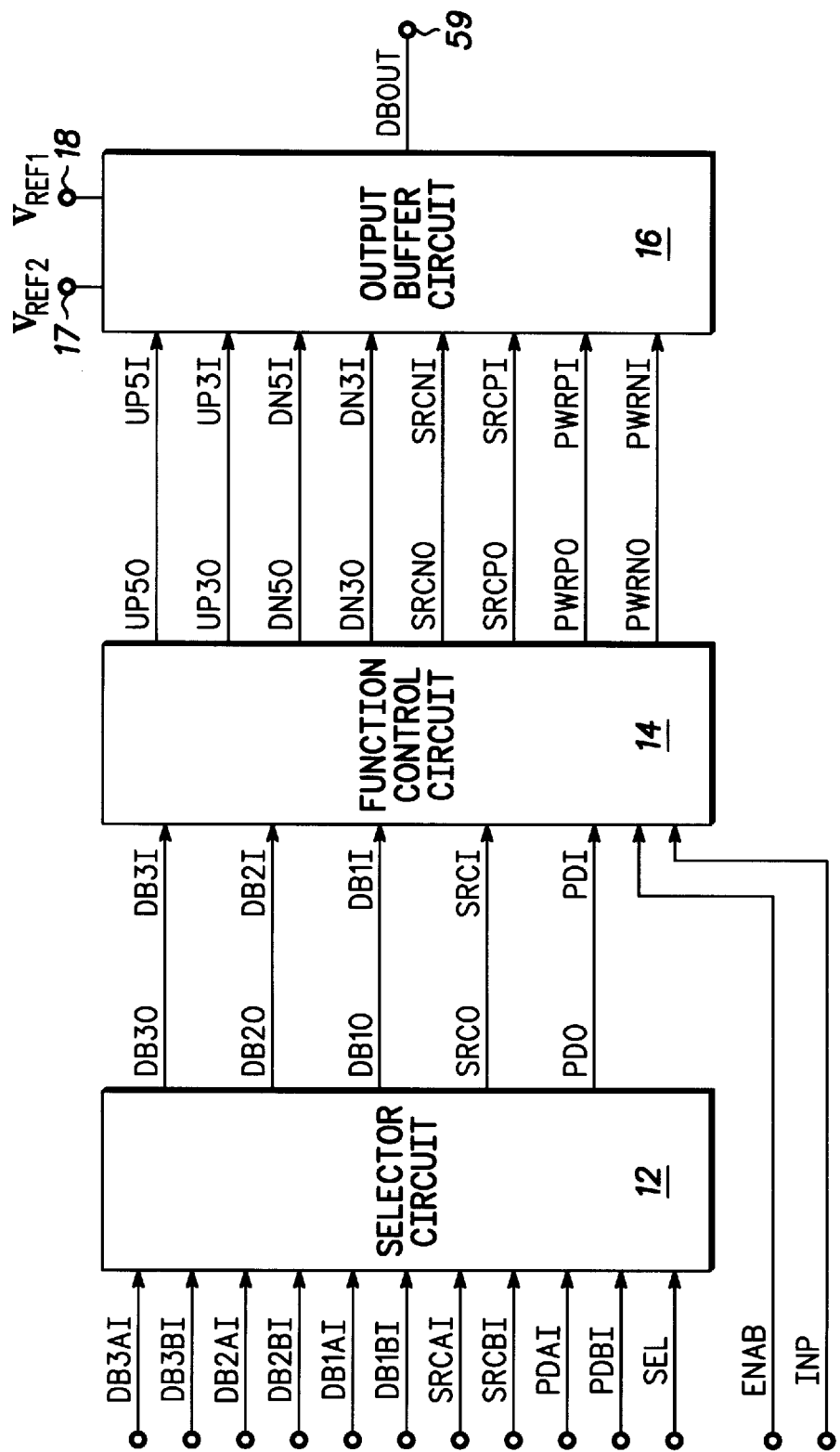
FIG. 1 is a block diagram of a multi-function programmable circuit in accordance with an embodiment of the present invention.

FIG. 1 is a block diagram of a multi-function programmable circuit 10 in accordance with an embodiment of the present invention. Multi-function programmable circuit 10 is a configurable output buffer that includes a selector circuit 12 coupled to a output buffer circuit 16 through a function control circuit 14. Selector circuit 12 has a plurality of input terminals coupled for receiving a plurality of input signals. More particularly, selector circuit 12 is coupled for receiving a first set of input signals, including three data bit input signals DB3A, DB2A, and DB1A at input terminals DB3AI, DB2AI, and DB1AI, respectively. Also, selector circuit 12 is coupled for receiving a slew rate control input signal, SRCA, at input terminal SRCAI and a power drive input signal, PDA, at input terminal PDAI. In addition, selector circuit 12 is coupled for receiving a second set of input signals, including three data bit input signals DB3B, DB2B, and DB1B at input terminals DB3BI, DB2BI, and DB1BI, respectively. Also, selector circuit 12 is coupled for receiving a slew rate control input signal, SRCB, at input terminal SRCBI and a power drive input signal, PDB, at input terminal PDBI. Selector circuit 12 serves as a multiplexer that transmits one of the sets of input signals to function control circuit 14 in accordance with a select signal, SELECT, transmitted to the input terminal SEL. The transmitted input signals become the output signals DB3, DB2, DB1, SRC, and PD of selector circuit 12 and are transferred to output terminals DB3O, DB2O, DB1O, SRCO, and PDO, respectively.

In accordance with a first embodiment, selector circuit 12 has two sets of input terminals, wherein a first set of input terminals includes three data bit input terminals (DB3AI, DB2AI, DB1AI), a slew rate control input terminal (SRCAI), and a power drive input terminal (PDAI). Likewise the second set of input terminals includes three data bit input terminals (DB3BI, DB2BI, DB1BI), a slew rate control input terminal (SRCBI), and a power drive input terminal (PDBI). Selector circuit 12 further includes an input terminal (SEL). Select circuit 12 further includes a plurality of data output terminals (DB3O, DB2O, DB1O), a slew-rate control output terminal (SRCO), and a power-drive output terminal (PDO).

Function control circuit 14 has a plurality of input terminals coupled for receiving the output signals from selector circuit 12. In accordance with the first embodiment, function control circuit 14 has three input terminals DB3I, DB2I, and DB1I connected to output terminals DB3O, DB2O, and DB1O, respectively, of selector circuit 12. An input terminal SRCI is connected to output terminal SRCO and an input terminal PDI is connected to power drive output terminal PDO of selector circuit 12. In addition, function control circuit 14 includes an enable input terminal ENAB and an input terminal INP. Function control circuit 14 further includes a plurality of output terminals UP5O, UP3O, DN5O, DN3O, SRCNO, SRCPO, PWRNO, and PWRPO. An embodiment of function control circuit 14 is further described with reference to FIG. 2.

Output buffer circuit 16 has a plurality of input terminals coupled for receiving the output signals from function control circuit 14. In accordance with the first embodiment, output buffer circuit 16 has input terminals UP5I, UP3I, DN5I, DN3I, SRCNI, SRCPI, PWRNI, and PWRPI connected to output terminals UP5O, UP3O, DN5O, DN3O, SRCNO, SRCPO, PWRNO, and PWRPO, respectively, of function control circuit 14. Output buffer circuit 16 has an output terminal 59, which is also the output terminal of multi-function programmable circuit 10. An embodiment of output buffer circuit 16 is further described with reference to FIG. 3.

In operation, selector circuit 12 has five sets of two-to-one multiplexers and operates in response to control signal SELECT for passing the entire first set of input signals DB3A, DB2A, DB1A, SRCA, and PDA or the entire second set of input signals DB3B, DB2B, DB1B, SRCB, and PDB to function control circuit 14. By way of example, the first set of input signals is passed to function control circuit 14 when select signal, SELECT, is at, for example, a logic zero voltage level. Likewise, the second set of input signals is passed to function control circuit 14 when select signal, SELECT, is at a logic one voltage level.

Selector circuit 12 provides options in the configuration of multi-function programmable circuit 10 in accordance with the logical value of the select signal SELECT. For example, the first set of input terminals may be coupled to a register (not shown) and the second set of input terminals may be coupled to a memory element (not shown). The register stores the first set of input signals and the memory element stores the second set of input signals. When the signal SELECT is at a logic zero voltage level, the register values, i.e., the first set of input signals is passed into function control circuit 14. When the signal SELECT is at a logic one voltage level, the memory values, i.e., the second set of input signals are transferred into function control circuit 14. Another embodiment has the first set of input terminals coupled for receiving preset logic values, wherein the output buffer circuit is set for a particular output configuration during a power-on sequence of the integrated circuit. Following power-on, the signal SELECT at a logic one level transfers the second set of input signals into function control circuit 14, thus providing the programmability for re-configuring output buffer circuit 16.

Function control circuit 14 is coupled for receiving the output signals DB3, DB2, DB1, SRC, and PD at the input terminals DB3I, DB2I, DB1I, SRCI, and PDI, respectively. In addition, function control circuit 14 has an input terminal, ENAB, coupled for receiving an input enable signal, EN, and an input terminal, INP, coupled for receiving an input signal, INPUT DATA. In accordance with logic values for the three data bit signals DB3, DB2, and DB1, and in combination with the two input signals EN and INPUT DATA, output control signals UP5, UP3, DN5, and DN3 are generated in function control circuit 14. Also, in accordance with logic values for the input signals SRC, PD, and EN, output control signals SRCN, SRCP, PWRN and PWRP are generated by function control circuit 14.

Output buffer circuit 16 is coupled for receiving the control signals UP5, UP3, DN5, DN3, SRCN, SRCP, PWRN and PWRP of function control circuit 14 at input terminals UP5I, UP3I, DN5I, DN3I, SRCNI, SRCPI, PWRNI and PWRPI, respectively. All eight control inputs configure output buffer circuit 16 for providing the output signal, DBOUT, at output terminal 59. Since output buffer circuit 16 can be configured for one of sixteen possible output modes, the present invention provides flexibility for matching the transitions of signal DBOUT to the requirements of an external peripheral device.

Figure 2:
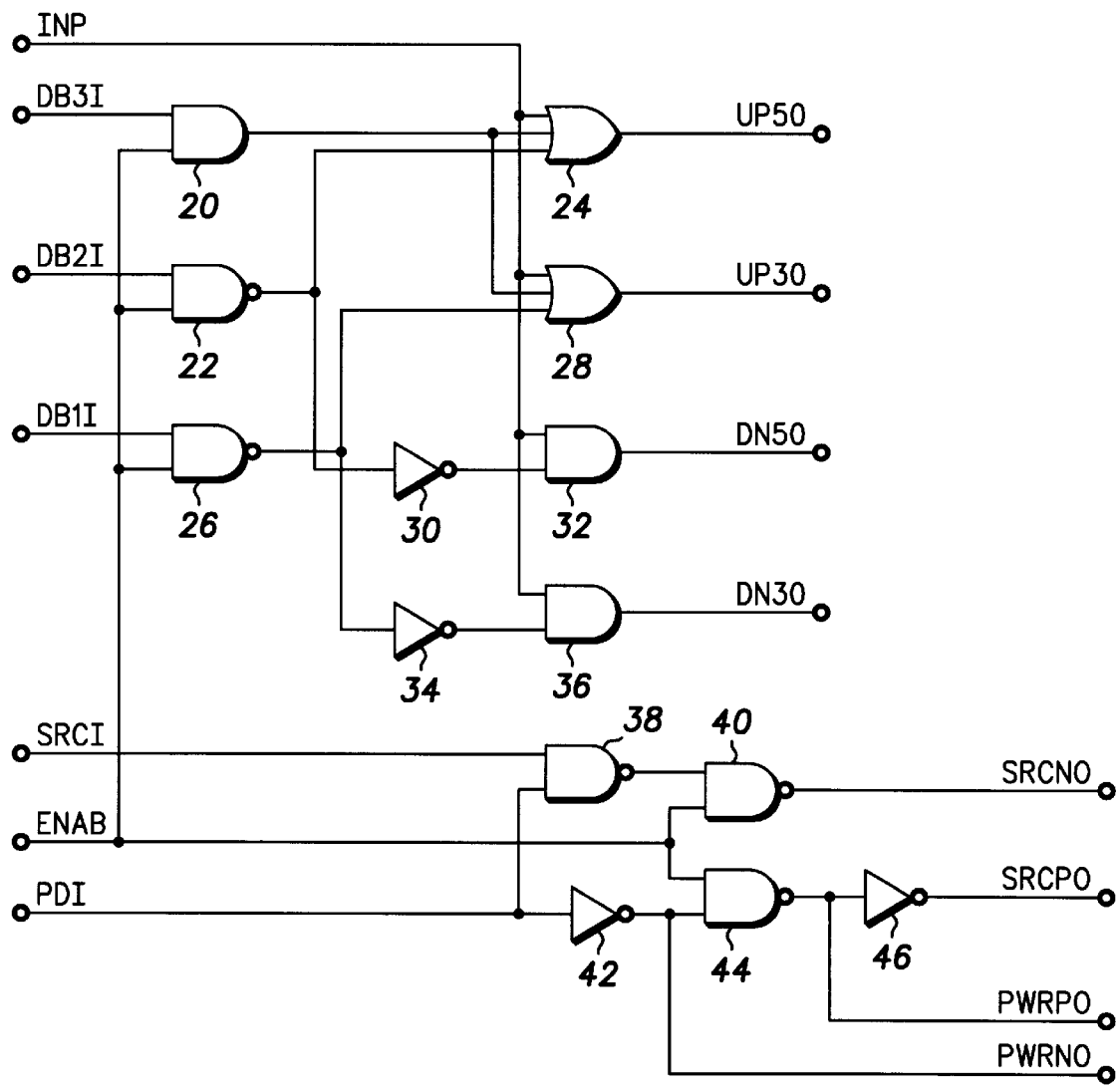
FIG. 2 is a schematic diagram of a function control circuit for the multi-function programmable circuit shown in FIG. 1.

FIG. 2 is a schematic diagram of an embodiment of function control circuit 14 of FIG. 1. A first level of logic gates includes AND gate 20, NAND gate 22, and NAND gate 26, wherein each gate 20, 22, and 26 has first and second input terminals. The first inputs of AND gate 20, NAND gate 22, and NAND gate 26 are coupled for receiving the signal EN. AND gate 20 has a second input coupled for receiving the control signal DB3; NAND gate 22 has a second input coupled for receiving the control signal DB2; and NAND gate 26 has a second input coupled for receiving the control signal DB1. A second level of logic gates includes inverters 30 and 34, wherein each inverter 30 and 34 has an input terminal and an output terminal. The input terminal of inverter 30 is connected to the output terminal of NAND gate 22 and the input terminal of inverter 34 is connected to the output terminal of NAND gate 26. A third level of logic gates includes a three-input OR gate 24, a three-input OR gate 28, a two-input AND gate 32, and a two-input AND gate 36. OR gate 24 and OR gate 28 have first, second, and third input terminals. AND gate 32 and AND gate 36 have first and second input terminals. The first input terminals of OR gate 24, OR gate 28, AND gate 32, and AND gate 36 are coupled for receiving the input signal INPUT DATA. OR gate 24 has a second input terminal connected to the output terminal of AND gate 20, and a third input terminal connected to the output terminal of NAND gate 22. The output terminal of OR gate 24 is connected to output terminal UP5O and is coupled for providing the control signal UP5. OR gate 28 has a second input terminal connected to the output terminal of AND gate 20, and a third input terminal connected to the output terminal of NAND gate 26. The output terminal of OR gate 28 is connected to output terminal UP3O and is coupled for providing the control signal UP3. AND gate 32 has a second input terminal connected to the output terminal of inverter 30. The output terminal of AND gate 32 serves as the output terminal DN5O of function control circuit. AND gate 36 has a second input terminal connected to the output terminal of inverter 34. The output terminal of AND gate 36 serves as the output terminal DN3O of function control circuit 14.

Still referring to FIG. 2, two-input NAND gate 38 has first and second input terminals. The first input terminal of NAND gate 38 serves as the input terminal SRCI and is coupled to receive the input signal SRC; and a second input terminal of NAND gate 38 serves as the input terminal PDI and is coupled for receiving the input signal PD. Inverter 42 has an input terminal connected to input terminal PDI. The output of inverter 42 is connected to the output terminal PWRNO and provides the control signal PWRN. Both two-input NAND gate 40 and two-input NAND gate 44 have first and second input terminals, wherein the first input terminals of NAND gates 40 and 44 are commonly connected for receiving the input signal EN. The second input terminal of NAND gate 40 is connected to the output terminal of NAND gate 38. The output terminal of NAND gate 40 serves as the output terminal SRCNO. The second input terminal of NAND gate 44 is connected to the output terminal of inverter 42. The output terminal of NAND gate 44 serves as the output terminal PWRPO. Inverter 46 has an input terminal connected to the output terminal of NAND gate 44 and the output terminal serves as the output terminal SRCPO.

In operation, the eight control signals, UP5, UP3, DN5, DN3, SRCN, SRCP, PWRN, and PWRP, as shown in FIG. 2, are used to configure output buffer circuit 16. The eight control signals have the values shown in Table 1 in accordance with the values of three input data bit signals DB3, DB2, and DB1, slew rate control input signal SRC, power drive input signal PD, and input enable signal EN.

TABLE 1

| | -INPUT SIGNALS- | | | -OUTPUT SIGNALS- | | | | | | | | |
|---|---|---|---|---|---|---|---|---|---|---|---|---|
| DATA BITS | SRC | PD | EN | UP5 | UP3 | DN5 | DN3 | SRCN | SRCP | PWRN | PWRP | |
| 111 | X | X | 1 | 1 | 1 | INP | INP | X | X | X | X | R1 |
| XXX | X | X | 0 | 1 | 1 | 0 | 0 | 1 | 0 | X | 1 | R2 |
| 010 | 1 | 1 | 1/EN | INP | 1 | INP | 0 | 1 | 0 | 0 | 1 | R3/a |
| 010 | 0 | 1 | 1/EN | INP | 1 | INP | 0 | 0 | 0 | 0 | 1 | R4/b |
| 010 | 1 | 0 | 1/EN | INP | 1 | INP | 0 | 0 | 1 | 1 | 0 | R5/c |
| 001 | 1 | 1 | 1/EN | 1 | INP | 0 | INP | 1 | 0 | 0 | 1 | R6/d |
| 001 | 0 | 1 | 1/EN | 1 | INP | 0 | INP | 0 | 0 | 0 | 1 | R7/e |
| 001 | 1 | 0 | 1/EN | 1 | INP | 0 | INP | 0 | 1 | 1 | 0 | R8/f |
| 011 | 1 | 1 | 1/EN | INP | INP | INP | INP | 1 | 0 | 0 | 1 | R9/g |

An entry of "1" in Table 1 represents a logic one whereas a "0" entry represents a logic zero. The table entry of INP implies that the output control signal has a logic value equivalent to that of the input data signal INPUT DATA. The table entry of "X" implies that the logic value is a "don't care" value. The input data bit signals DB3, DB2, and DB1, respectively, are presented in Table 1 as the entry DATA BITS. In the first mode of output operation, signal EN is held at a logic one voltage level and provides outputs in accordance with values found in Table 1. In the second mode of operation, signal EN transitions in a controllable manner for providing seven additional output configurations listed on the right side of Table 1 as a–g. While in the second mode of operation, the signal EN is controllable and the output buffer is configured as a tri-stateable output buffer. The input enable signal EN and the input signals DATA BITS, SRC, and PD control the transitions from one configuration to another for output buffer circuit 16. The Table 1 entry for row two, R2, has a logic zero value for the signal EN. The signals UP3 and UP5 with logic one levels and the signals DN3 and DN5 with logic zero levels disable the output buffer circuit from sinking and sourcing current from the output terminal 59. The disabling of the output signal from transitioning is the configuration for being in tri-state. The Table 1 entries for the signal EN at a logic one level correspond to controlling the signals UP5, UP3, DN5, DN3, SRCN, SRCP, PWRN, and PWRP in accordance with the transition of the EN signal. The table entry values of R1, R2, etc. are further described infra.

Referring to row three of Table 1, input signals DB3, DB2, and DB1 have logic values of 010, respectively, input signal SRC has a logic value of 1, and input signal PD has a logic value of 1. In accordance with these input values, output signal UP5 and input signal INPUT DATA have the same logic values, output signal UP3 has a logic value of 1, output signal DN5 and input signal INPUT DATA have the same logic values, output signal DN3 has a logic value of 0, output signal SRCN has a logic value of 1, output signal SRCP has a logic value of 0, output signal PWRN has a logic value of 0, and output signal PWRP has a logic value of 1. Thus, function control circuit 14 provides programmable options for the configuration of output buffer circuit 16 which are a function of the combination of input signals.

Figure 3:
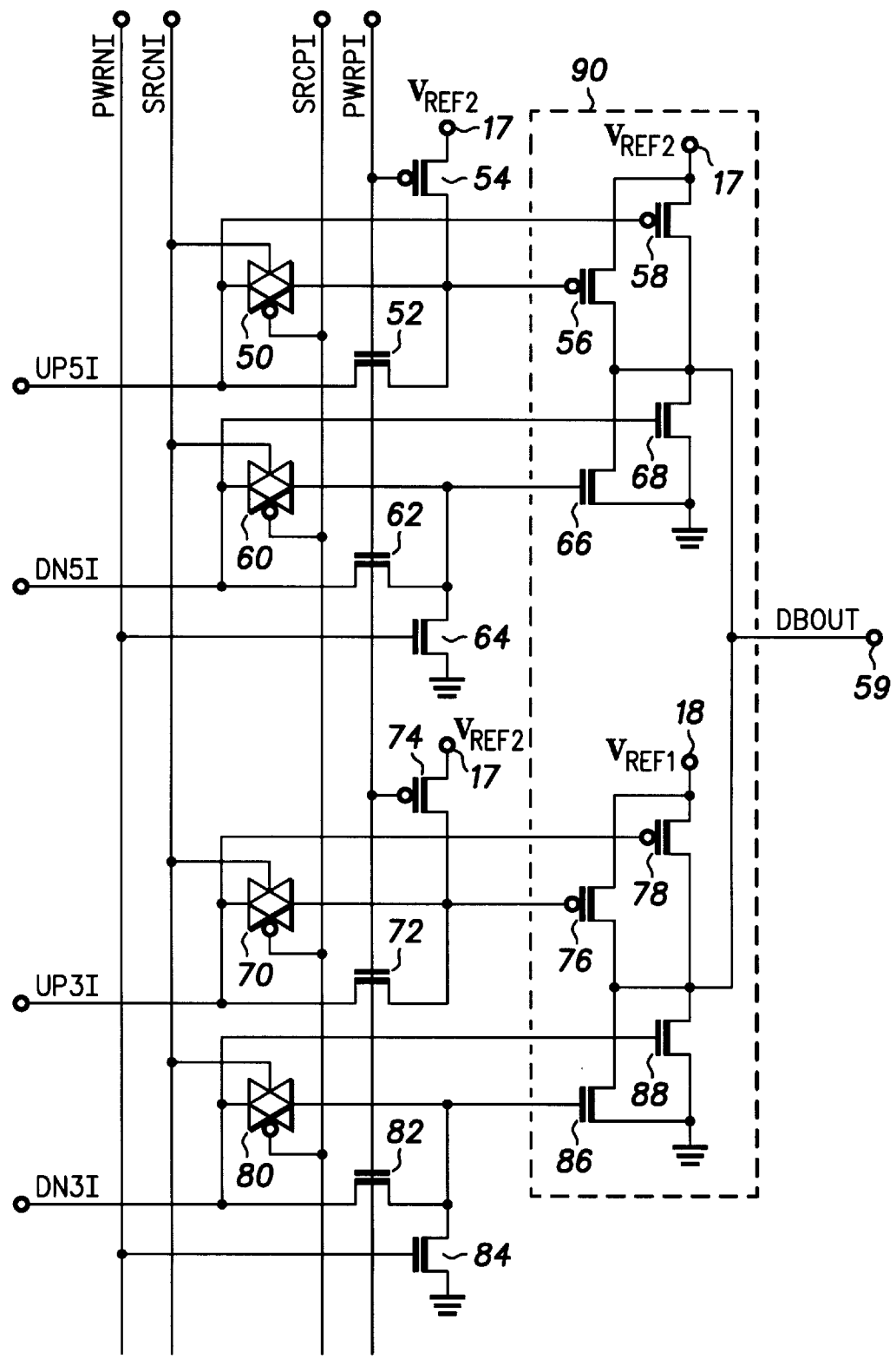
FIG. 3 is a schematic diagram of an output buffer circuit for the multi-function programmable circuit shown in FIG. 1.

FIG. 3 is a schematic diagram of an output buffer circuit 16 in accordance with an embodiment of the present invention for multi-function programmable circuit 10 shown in FIG. 1. Output buffer circuit 16 includes a transmission gate 50 connected to an N-channel Metal Oxide Semiconductor Field Effect Transistor (MOSFET) 52 and a P-channel MOSFET 54. Transmission gate 50, N-channel MOSFET 52, and P-channel MOSFET 54 cooperate to control the P-channel MOSFETs 56 and 58 in providing the current source output buffer drive strength of output driver 90. MOSFETs 56 and 58 together provide the high drive current source capabilities at output terminal 59 for operating potentials, such as five volts. MOSFET 58, operating without MOSFET 56, is the low drive current source transistor. Transmission gate 50 has an input, a control terminal, a complementary control terminal, and an output, wherein the input is coupled for receiving the signal UP5, the control terminal is coupled for receiving the signal SRCN, and the complementary control terminal is coupled for receiving the signal SRCP. N-channel MOSFET 52 has a gate coupled for receiving the signal PWRP, a source coupled for receiving the signal UP5, and a drain coupled to the output of transmission gate 50. P-channel MOSFET 54 has a gate coupled for receiving the signal PWRP, a source coupled to terminal 17 and a drain coupled to the output of transmission gate 50. P-channel MOSFETs 56 and 58 provide output driver 90 with a portion of the current sourcing capabilities for driving the output signal DBOUT. Specifically, P-channel MOSFET 56 has a gate connected to the output of transmission gate 50, a source connected to terminal 17 and a drain coupled to terminal 59 for providing the output signal DBOUT. P-channel MOSFET 58 has a gate coupled for receiving the signal UP5, a source connected to terminal 17 and a drain coupled to terminal 59. An operating potential $V_{CC}$, such as five volts, is supplied at terminal 17 as the second reference voltage $V_{REF2}$.

Output buffer circuit 16 includes a transmission gate 60 connected to N-channel MOSFETs 62 and 64. Transmission gate 60 and N-channel MOSFETs 62 and 64 cooperate to control the N-channel MOSFETs 66 and 68 of output driver 90. Transmission gate 60 has an input, a control terminal, a complementary control terminal, and an output, wherein the input is coupled for receiving the signal DN5, the control terminal is coupled for receiving the signal SRCN, and the complementary control terminal is coupled for receiving the signal SRCP. N-channel MOSFET 62 has a gate coupled for receiving the signal PWRP, a source coupled for receiving the signal DN5, and a drain coupled to the output of transmission gate 60. N-channel MOSFET 64 has a gate coupled for receiving the signal PWRN, a source coupled to ground reference and a drain coupled to the output of transmission gate 60. N-channel MOSFETs 66 and 68 together provide output driver 90 with the high drive current sink capabilities for driving the output signal DBOUT. MOSFET 68, operating without MOSFET 66, is the low drive current sink transistor. Specifically, N-channel MOSFET 66 has a gate terminal connected to the output of transmission gate 60, a source coupled to ground, and a drain coupled to terminal 59. N-channel MOSFET 68 has a gate terminal coupled for receiving the signal DN5, a source connected to ground and a drain connected to the drain of MOSFET 66. The drains of MOSFETs 56, 58, 66, and 68 are commonly connected and form the output node for terminal 59 at which the signal DBOUT is provided.

Still referring to FIG. 3, output buffer circuit 16 includes a transmission gate 70 connected to an N-channel MOSFET 72 and a P-channel MOSFET 74. Transmission gate 70, N-channel MOSFET 72, and P-channel MOSFET 74 cooperate to control the P-channel MOSFETs 76 and 78 of output driver 90. Transmission gate 70 has an input, a control terminal, a complementary control terminal, and an output; wherein the input is coupled for receiving the signal UP3, a control terminal is coupled for receiving the signal SRCN, and a complementary control terminal is coupled for receiving the signal SCRP. N-channel MOSFET 72 has a gate coupled for receiving the signal PWRP, a source coupled for receiving the signal UP3, and a drain coupled to the output of transmission gate 70. P-channel MOSFET 74 has a gate coupled for receiving the signal PWRP, a source connected to terminal 17 and a drain coupled to the output of transmission gate 70. P-channel MOSFETs 76 and 78 provide output driver 90 with a portion of the current sourcing capabilities for driving the output signal DBOUT. Specifically, P-channel MOSFET 76 has a gate connected to the output of transmission gate 70, a source connected to terminal 18 and a drain coupled to terminal 59 for providing the output signal DBOUT. P-channel MOSFET 78 has a gate coupled for receiving the signal UP3, a source connected to terminal 18, and a drain connected to terminal 59. An operating potential $V_{CC}$, such as three volts, is supplied at terminal 18 as the first reference voltage $V_{REF1}$.

Output buffer circuit 16 includes a transmission gate 80 connected to N-channel MOSFETs 82 and 84. Transmission gate 80 and N-channel MOSFETs 82 and 84 cooperate to control the N-channel MOSFETs 86 and 88 of output driver 90. Transmission gate 80 has an input, a control terminal, a complementary control terminal, and an output, wherein the input is coupled for receiving the signal DN3, the control terminal is coupled for receiving the signal SRCN, and the complementary control terminal is coupled for receiving the signal SRCP. N-channel MOSFET 82 has a gate coupled for receiving the signal PWRP, a source coupled for receiving the signal DN3, and a drain coupled to the output of transmission gate 80. N-channel MOSFET 84 has a gate coupled for receiving the signal PWRN, a source connected to ground reference and a drain coupled to the output of transmission gate 80. N-channel MOSFETs 86 and 88 provide output driver 90 with a portion of the current sinking capabilities for driving the output signal DBOUT. Specifically, N-channel MOSFET 86 has a gate terminal connected to the output of transmission gate 80, a source connected to ground, and a drain connected to terminal 59. N-channel MOSFET 88 has a gate terminal coupled for receiving the signal DN3, a source connected to ground and a drain connected to the drain of MOSFET 86. The drains of MOSFETs 76, 78, 86, and 88 are commonly connected to terminal 59 which provides the signal DBOUT.

In operation, output buffer circuit 16 is configured in accordance with the input control signals received from function control circuit 14. Table 2 lists an example of the configurations available to output buffer circuit 16 in generating the output signal, DBOUT, at terminal 59.

TABLE 2

FUNCTION OF OUTPUT BUFFER FOR SIGNAL DBOUT

| | |
|---|---|
| R1 | Open-drain |
| R2 | input buffer, output buffer is disabled |
| R3/a | Five volts, sink and source 12 ma, CMOS/tri-state |
| R4/b | Five volts, sink and source 12 ma, with slew rate, CMOS/tri-state |
| R5/c | Five volts, sink and source 6 ma, CMOS/tri-state |
| R6/d | Three volts, sink and source 8 ma, CMOS/tri-state |
| R7/e | Three volts, sink and source 8 ma, with slew rate, CMOS/tri-state |
| R8/f | Three volts, sink and source 4 ma, CMOS/tri-state |
| R9/g | Five volts, PCI bus drive, CMOS/tri-state |

The right-hand side of Table 1 corresponds to the left-hand side of Table 2 and shows the configurations available for providing the signal DBOUT from output buffer circuit 16. It should be noted that in row nine, i.e., the row labeled R9/g of Table 2, the term PCI refers to a Peripheral Component Interconnect bus and "PCI bus drive" refers to the strength of signals on the PCI bus. In the example described with reference to Table 1, logic values of 010 for input signals DB3, DB2, and DB1, respectively, a logic value of 1 for input signal SRC, and a logic value of 1 for input signal PD provide the result R3 (see Table 2). In accordance with these inputs and the generated control outputs from function control circuit 14, output terminal 59 provides a complementary metal oxide semiconductor (CMOS) output signal, DBOUT. Corresponding with the listing for row R3 of Table 2, the output signal DBOUT provided at terminal 59 is capable of sourcing and sinking twelve milliamps of current and transitioning between a five volt supply and ground reference.

The listed sink current, such as 12 ma, is measured as current into terminal 59 when the signal DBOUT is at a 0.4 volt output level. A source current, such as 12 ma, is measured as current out of terminal 59 when the signal DBOUT is at a 2.4 volt output level. As described supra, terminal 59 can be configured to provide a digital output signal DBOUT which transitions between a three volt operating supply and ground or a five volt operating supply and ground. When output buffer circuit 16 is programmed to be in an open-drain configuration, P-channel output MOSFETs 56, 58, 76, and 78, are non-conducting. In the open-drain configuration, signal DBOUT is an open drain output signal. When output buffer circuit 16 is programmed to be in a tri-state configuration and input signal EN is held at a logic zero voltage level, P-channel output MOSFETs 56, 58, 76 and 78 and the N-channel output MOSFETs 66, 68, 86, and 88 are non-conducting. In this configuration, signal DBOUT is a tri-state output signal. The input enable signal EN and the input signals DATA BITS, SRC, and PD control the transitions from one configuration to another for output buffer circuit 16.

With control signal SRC at a logic zero voltage level, activation of slew rate logic adds signal path delays to slow the rise and fall transition times for the output signal DBOUT. With input values having the values listed in row R4 of Table 2, output buffer circuit 16 is configured for five volt operation when the slew rate logic is active. Thus, the gate terminal of P-channel MOSFET 58 is connected to the input signal UPS such that MOSFET 58 responds immediately to the input signal. The gate of P-channel MOSFET 56 is coupled to the input signal through conducting transmission gate 50. Transmission gate 50 with small N-channel and P-channel device sizes acts as a resistive path for charging the capacitor associated with the gate terminal of MOSFET 56. Therefore MOSFET 56 is delayed in responding to the input signal UPS. For five volt operation and input conditions matching selection of row R4 in Table 2, MOSFETs 56 and 58 and transmission gate 50 are activated as slew rate logic for adding a delay path for output signal DBOUT in a current sourcing mode. Similarly, MOSFETs 66 and 68 and transmission gate 60 are activated as slew rate logic for adding a delay path for output signal DBOUT in a current sinking mode. For the three volt operating potential and input conditions matching selection of row R4 in Table 2, MOSFETs 76 and 78 and transmission gate 70 are activated as slew rate logic for adding a delay path for output signal DBOUT in a current sourcing mode. Similarly, MOSFETs 86 and 88 and transmission gate 80 are activated as slew rate logic for adding a delay path for output signal DBOUT in a current sinking mode.

Another configuration of output buffer circuit 16 is controlled by the input signal PD into function control circuit 14 that selects the current sourcing and current sinking capabilities at terminal 59 for output signal DBOUT. When signal PD is at a logic one voltage level, both MOSFETs 76 and 78 are active for sourcing current and both MOSFETs 86 and 88 are active for sinking current from terminal 59. Whereas, when signal PD is at a logic zero voltage level, only MOSFET 78 is active for sourcing current and only MOSFET 88 is active for sinking current at terminal 59.

Another configuration of output buffer circuit 16 is controlled by the input signals that match the selection for row R9/g of Table 1. In this configuration output buffer circuit 16 is in a Peripheral Component Interconnect (PCI) output option. When multi-function programmable circuit 10 is configured for driving the PCI bus, the operating potential $V_{CC}$ at terminals 17 and 18 is externally connected to a common supply, such as a five volt supply. Function control circuit 14 couples the data input signal INPUT DATA to the gates of P-channel MOSFETs 56, 58, 76, and 78, and to the gates of N-channel MOSFETs 66, 68, 86, and 88. With this configuration the output buffer will meet the PCI local bus alternating current (AC) specification for five volt signaling. The PCI specification takes advantage of inherent reflections in the output signal wave generated by signal DBOUT at terminal 59. Reflected wave switching in the PCI mode achieves full voltage transitions from currents that are lower than buffer currents when transmission line effects are not considered.

By now it should be appreciated that a programmable output buffer on a monolithic integrated circuit has been provided. The circuit of the present invention allows selection between sixteen output configurations, allows versatility and cost savings in providing the proper signaling interface to external peripheral devices.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, multi-function programmable output buffer circuit 10 has been described with Complementary Metal Oxide Semiconductor (CMOS) components. Other device types such as Junction Field Effect Transistors (JFETs), N-channel MOSFETs, bipolar transistors, etc., could be used in accordance with the present invention.

What is claimed is:

1. A programmable output buffer, comprising:

a selector circuit having a first plurality of input terminals, a second plurality of input terminals, a plurality of output terminals, and a selector signal that selects one of first and second sets of signals applied at the respective first and second plurality of input terminals for transfer to the plurality of output terminals;

a function control circuit having a plurality of output terminals and a plurality of input terminals coupled to the plurality of output terminals of the selector circuit; and an output buffer circuit having at least one output and a plurality of input terminals coupled to the plurality of output terminals of the function control circuit.

2. The programmable output buffer of claim 1, wherein the function control circuit can program the output buffer circuit through the plurality of output terminals to be tri-stated.

3. The programmable output buffer of claim 2, wherein the at least one output of the output buffer circuit is an open-drain output.

4. The programmable output buffer of claim 1, wherein the at least one output provides an output signal having a voltage value between a first reference voltage and ground.

5. The programmable output buffer of claim 4, wherein the at least one output provides the output signal having a voltage value between a second reference voltage and ground.

6. The programmable output buffer of claim 5, wherein the at least one output is programmed for a first low drive current sink and a first low drive source output in accordance with the first reference voltage.

7. The programmable output buffer of claim 6, wherein the at least one output is programmed for a second low drive current sink and a second low drive current source output in accordance with the second reference voltage.

8. The programmable output buffer of claim 3, wherein the at least one output is programmed having one of a first and second slew rate.

9. The programmable output buffer of claim 1, wherein the at least one output provides an output signal for driving a Peripheral Component Interconnect (PCI) bus, wherein a drive strength of the output signal is programmable.

10. A configurable output buffer, comprising:

a function control circuit having at least one input and at least one output, wherein the at least one input of the function control circuit is coupled to a data bit; and an output buffer circuit having at least one input and at least one output, wherein the at least one input of the output buffer circuit is coupled to the at least one output of the function control circuit and the at least one output of the output buffer circuit serves as an output of the configurable output buffer which can be programmed to provide an output signal having a voltage value between one of a first and second reference voltage and ground.

11. The configurable output buffer of claim 10, wherein the configurable output buffer can be programmed as a tri-state configurable output buffer.

12. The configurable output buffer of claim 10, wherein the configurable output buffer can be programmed as an open-drain configurable output buffer.

13. The configurable output buffer of claim 10, wherein the configurable output buffer is programmed to provide a first current sink and a first current source output buffer drive strength in accordance with the first reference voltage and a second current sink and a second current source output buffer drive strength in accordance with the second reference voltage.

14. The configurable output buffer of claim 13, wherein the configurable output buffer is programmed for a third current sink and a third current source output buffer drive strength in accordance with the first reference voltage.

15. The configurable output buffer of claim 10, wherein the configurable output buffer is programmed to provide a first slew rate in accordance with the first reference voltage and a second slew rate in accordance with the second reference voltage.

16. The configurable output buffer of claim 10, wherein the configurable output buffer is programmed to provide the output signal for driving a Peripheral Component Interconnect (PCI) bus.

17. A method for programming an output buffer circuit comprising the steps of:

selecting between first and second sets of input signals to form a selected input signal; and generating at least one control signal for configuring the output buffer circuit in accordance with the selected input signal.

18. The method of claim 17, wherein the step of selecting between first and second sets of input signals includes using a multiplexer to select between the first and second sets of input signals.

* * * * *